US011183993B2

(12) United States Patent
Shin et al.

(10) Patent No.: US 11,183,993 B2
(45) Date of Patent: Nov. 23, 2021

(54) APPARATUS FOR GENERATING A PLURALITY OF PHASE-SHIFTED CLOCK SIGNALS, ELECTRONIC SYSTEM, BASE STATION AND MOBILE DEVICE

(71) Applicant: Intel Corporation, Santa Clara, CA (US)

(72) Inventors: Hundo Shin, Santa Clara, CA (US); Kameran Azadet, San Ramon, CA (US); Martin Clara, Santa Clara, CA (US); Daniel Gruber, St. Andrae (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/724,564

(22) Filed: Dec. 23, 2019

(65) Prior Publication Data
US 2021/0194473 A1 Jun. 24, 2021

(51) Int. Cl.
*H03H 11/16* (2006.01)
*H03K 5/13* (2014.01)
(Continued)

(52) U.S. Cl.
CPC ...... *H03K 5/13* (2013.01); *H03K 2005/00286* (2013.01); *H04W 88/02* (2013.01); *H04W 88/08* (2013.01)

(58) Field of Classification Search
CPC ........... H03K 5/13; H03K 2005/00052; H03K 2005/00286; H03L 7/0814; H03L 7/0812
(Continued)

(56) References Cited

U.S. PATENT DOCUMENTS 7,612,621 B2 * 11/2009 Kim .................. H03K 5/13
327/156
10,469,061 B1 * 11/2019 Lin .................. H03K 3/037
(Continued)

FOREIGN PATENT DOCUMENTS

EP       2849022 A1    3/2015
WO    2008005048 A2    1/2008

OTHER PUBLICATIONS

Kyu-Hyoun Kim et al., A 2.6mW 370MHz-to-2.5GHz Open-Loop Quadrature Clock Generator, ISSCC 2008, Session 25, Building Blocks for High-Speed Transceivers, 25.4, 2008 IEEE International Solid-State Circuits Conference, pp. 458, 459, 627.
(Continued)

*Primary Examiner* — Quan Tra
(74) *Attorney, Agent, or Firm* — 2SPL Patent Attorneys PartG mbB; Yong Beom Hwang

(57) ABSTRACT

An apparatus for generating a plurality of phase-shifted clock signals is provided. The apparatus comprises a first input node configured to receive a first reference clock signal. Further, the apparatus comprises a second input node configured to receive a second reference clock signal. The apparatus comprises a plurality of output nodes each configured to output one of the plurality of phase-shifted clock signals. Additionally, the apparatus comprises a cascade of coupled clock generation circuits configured to generate the plurality of phase-shifted clock signals based on the first reference clock signal and the second reference clock signal. Input nodes of the first clock generation circuit of the cascade of clock generation circuits are coupled to the first input node and the second input node. Output nodes of the last clock generation circuit of the cascade of clock generation circuits are coupled to the plurality of output nodes. At least one of the plurality of clock generation circuits is an
(Continued)

active circuit, and at least one of the plurality of clock generation circuits is a passive circuit.

14 Claims, 5 Drawing Sheets

(51) Int. Cl.
    *H03K 5/00*       (2006.01)
    *H04W 88/02*     (2009.01)
    *H04W 88/08*     (2009.01)

(58) Field of Classification Search
    USPC .................................................. 327/231–255
    See application file for complete search history.

(56) References Cited

U.S. PATENT DOCUMENTS

| | | | |
|---|---|---|---|
| 10,566,958 B1 * | 2/2020 | Song | ........................ G06F 1/06 |
| 2003/0117201 A1 | 6/2003 | Wang | |
| 2007/0090867 A1 * | 4/2007 | Kim | ..................... H03K 5/1504 |
| | | | 327/291 |
| 2015/0070066 A1 * | 3/2015 | Dedic | ....................... G06F 1/10 |
| | | | 327/254 |
| 2015/0372665 A1 | 12/2015 | Tohidian et al. | |

OTHER PUBLICATIONS

Ka-Fai Un et al., Analysis and Design of Open-Loop Multiphase Local-Oscillator Generator for Wireless Applications, IEEE Transactions on Circuits and Systems—I: Regular Papers, vol. 57, No. 5, May 2010, pp. 970-981.

Jouni Kaukovuori, Analysis and Design of Passive Polyphase Filters, IEEE Transactions on Circuits and Systems—I: Regular Papers, vol. 55, No. 10, Nov. 2008, pp. 3023-3037.

* cited by examiner

APPARATUS FOR GENERATING A PLURALITY OF PHASE-SHIFTED CLOCK SIGNALS, ELECTRONIC SYSTEM, BASE STATION AND MOBILE DEVICE

FIELD

The present disclosure relates to clock generation. In particular, examples relate to an apparatus for generating a plurality of phase-shifted clock signals, an electronic system, a base station and a mobile device.

BACKGROUND

Exclusively passive multiphase clock generation using passive RC polyphase filters requires a sinusoidal input signal and buffers between each passive stage. Therefore, the phase accuracy of the exclusively passive multiphase clock generation is degraded.

Exclusively active multiphase clock generation using active circuits exhibits a higher power consumption than passive circuitry. Further, the active circuits suffer from a higher random variation than passive circuitry.

In other words, conventional multiphase clock generation suffers from high power consumption and phase inaccuracy.

Hence, there may be a desire for improved multiphase clock generation.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
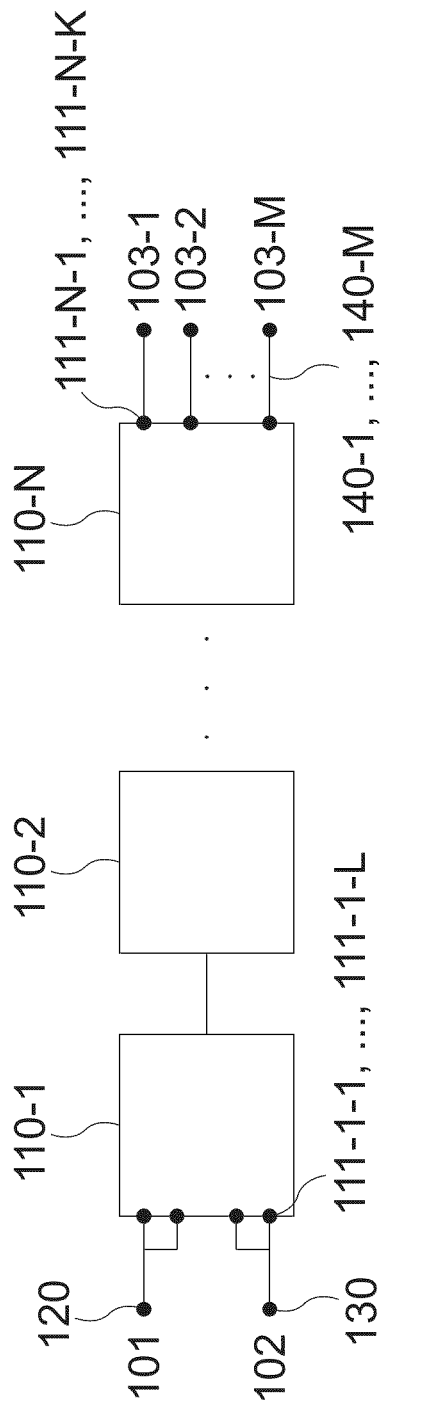
FIG. 1 illustrates a first example of an apparatus for generating a plurality of phase-shifted clock signals.

FIG. 1 illustrates an example of apparatus 100 for generating a plurality of phase-shifted clock signals 103-1, ..., 103-M. The plurality of phase-shifted clock signals 103-1, ..., 103-M may be any number M≥2 of phase-shifted clock signals. For example, the plurality of phase-shifted clock signals 103-1, ..., 103-M may be four or more phase-shifted clock signals (i.e. M may be four).

The apparatus 100 comprises a first input node 120 configured to receive a first reference clock signal 101, and a second input node 130 configured to receive a second reference clock signal 102. Additionally, the apparatus 100 comprises a plurality of output nodes 140-1, ..., 140-M each configured to output one of the plurality of phase-shifted clock signals 103-1, ..., 103-M.

The first reference clock signal 101 and the second reference clock signal 102 are input clock signals for the apparatus. The apparatus 100 is configured to generate the plurality of phase-shifted clock signals 103-1, ..., 103-M based on the first reference clock signal 101 and the second reference clock signal 102. The first reference clock signal 101 and the second reference clock signal 102 are identical signals that are phase-shifted with respect to each other (the phase shift may be any value >0° and <360°). For example, the first reference clock signal 101 and the second reference clock signal 102 may be sinusoidal signals or square wave signals. The second reference clock signal 102 may be inverted with respect to the first reference clock signal 101 (i.e. the signals may be phase-shifted by 180°).

A cascade of coupled clock generation circuits 110-1, ..., 110-N is coupled between the input nodes 120, 130 and the output nodes 140-1, ..., 140-M. The cascade of coupled clock generation circuits 110-1, ..., 110-N is configured to generate the plurality of phase-shifted clock signals 140-1, ..., 140-M based on the first reference clock signal 101 and the second reference clock signal 102. The cascade of coupled clock generation circuits 110-1, ..., 110-N may be any number N≥2 of clock generation circuits coupled in series.

Each of the plurality of clock generation circuits 110-1, ..., 110-N comprises a respective plurality of input nodes for receiving a plurality of input clock signals, and a respective plurality of output nodes for outputting a plurality of output clock signals. Each of the plurality of clock generation circuits 110-1, ..., 110-N is configured to generate its respective output clock signals based on the respectively received input clock signals. For each of the plurality of clock generation circuits 110-1, ..., 110-N, the respective plurality of input nodes may be any number L≥2 of input nodes. For each of the plurality of clock generation circuits 110-1, ..., 110-N, the respective plurality of output nodes may be any number K≥2 of input nodes. In some examples, the respective number of input nodes and/or the respective number of output nodes of each of the plurality of clock generation circuits 110-1, ..., 110-N may be equal to the number M of phase-shifted clock signals 103-1, ..., 103-M.

As can be seen from FIG. 1, input nodes 111-1-1, ..., 111-1-L of the first clock generation circuit 110-1 of the cascade of clock generation circuits 110-1, ..., 110-N are coupled to the first input node 120 and the second input node 130. Output nodes 111-N-1, ..., 111-N-K of the last clock generation circuit 110-N of the cascade of clock generation circuits 110-1, ..., 110-N are coupled to the plurality of output nodes 140-1, ..., 140-M.

At least one of the plurality of clock generation circuits 110-1, ..., 110-N is an active circuit, and at least one of the plurality of clock generation circuits 110-1, ..., 110-N is a passive circuit. A passive clock generation circuit comprises exclusively passive electronic elements (components, devices). In other words, a passive clock generation circuit does not comprise any active electronic elements (components, devices). On the other hand, an active clock generation circuit comprises at least one active electronic element. A passive electronic component is a component incapable of controlling a current of an electrical signals by means of another electrical signal (an example for a passive device may be a resistor or a capacitor). An active component is a component capable of electrically control electric charge flow (an example for an active device may be a transistor or a circuit based on transistors).

The apparatus 100, hence, uses a combination of active and passive circuits to generate the plurality of phase-shifted clock signals 103-1, ..., 103-M based on the first reference clock signal 101 and the second reference clock signal 102. Compared to conventional exclusively active multiphase clock generation, the apparatus 100 may exhibit reduced power consumption and improved phase accuracy. Compared to conventional exclusively passive multiphase clock generation, the apparatus 100 may exhibit improved phase accuracy. Hence, the apparatus 100 may enable improved multiphase clock generation.

Within the cascade of clock generation circuits 110-1, ..., 110-N, active and passive clock generation circuits may be arranged in any desired order (sequence). For example, the cascade of clock generation circuits 110-1, ..., 110-N may comprise a plurality of passive clock generation circuits and a plurality of active clock generation circuits coupled alternatingly in series (e.g. two passive clock generation circuits and two active clock generation circuits may be coupled alternatingly in series). In some examples, the cascade of clock generation circuits 110-1, ..., 110-N may comprise at least two passive clock generation circuits coupled in series. In other examples, the cascade of clock generation circuits 110-1, ..., 110-N may comprise at least two active clock generation circuits coupled in series.

In some examples, the cascade of coupled clock generation circuits 110-1, ..., 110-N may comprise two clock generation circuits (i.e. N=2). In this configuration, the first clock generation circuit 110-1 of the cascade of clock generation circuits 110-1, ..., 110-N is a passive circuit, and the last clock generation circuit 110-2 of the cascade of clock generation circuits 110-1, ..., 110-N is an active circuit.

In other examples, the cascade of coupled clock generation circuits 110-1, ..., 110-N may comprise at least three, four, five, six, seven, eight, sixteen or more clock generation circuits.

The thus generated plurality of phase-shifted clock signals 103-1, ..., 103-M may be phase shifted by a predetermined phase shift with respect to each other. For example, the phase shift may be equal to 360°/M.

An example for an active clock generation circuit is an injection-locked oscillator. However, the proposed architecture is not limited to using injection-locked oscillators as active clock generation circuits. In general, any active clock generation circuit comprising at least one active electronic element may be used.

An example for a passive clock generation circuit is a RC polyphase filter, wherein the number of polyphases of the RC polyphase filter is equal to the number the plurality of phase-shifted clock signals. The RC polyphase filter comprises for each polyphase a resistive element (R) and a capacitive element (C) coupled in parallel between the respective input node and the respective output node for the polyphase. However, the proposed architecture is not limited to using RC polyphase filters as passive clock generation circuits. In general, any active clock generation circuit free from active electronic elements may be used.

Figure 2:
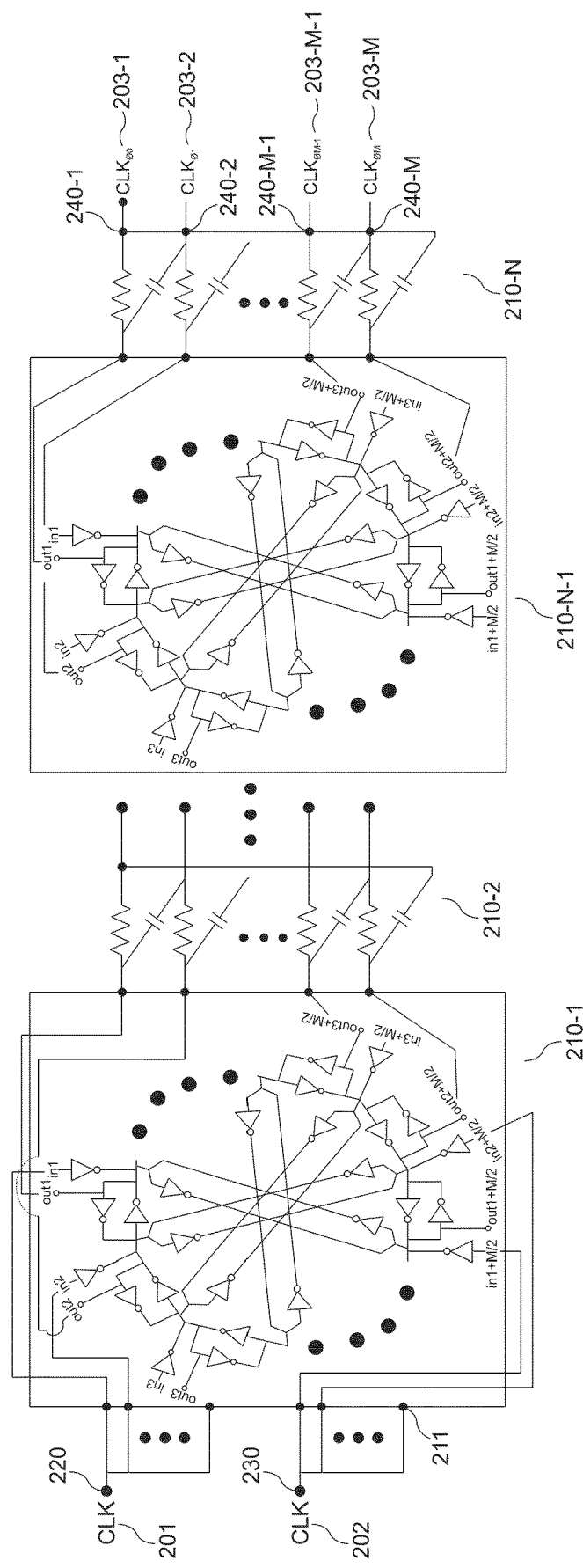
FIG. 2 illustrates a second example of an apparatus for generating a plurality of phase-shifted clock signals.

Another example of an apparatus 200 for generating a plurality of phase-shifted clock signals is illustrated in FIG. 2. The apparatus 200 is an N-stages hybrid multiphase clock generator.

The apparatus 200 comprises a cascade of clock generation circuits 210-1, ..., 210-N. The cascade of clock generation circuits 210-1, ..., 210-N comprises a plurality of passive clock generation circuits and a plurality of active clock generation circuits coupled alternatingly in series. The active clock generation circuits 210-$i$ (i={2k−1|k∈ℕ} & i≤N−1) are injection-locked oscillators, whereas the passive clock generation circuits 210-$j$ (j={2/l|l∈ℕ} & l≤N) are RC polyphase filters.

The apparatus 200 comprises a first input node 220 configured to receive a first reference clock signal 201, and a second input node 230 configured to receive a second reference clock signal 202. The second reference clock signal 202 is inverted with respect to the first reference clock signal 201.

The input nodes of the first active clock generation circuit 210-1 are coupled to the first input node 220 and the second input node 230. The output nodes of the first active clock generation circuit 210-1 are coupled to the input nodes of the first passive clock generation circuit 210-2. The output nodes of the first passive clock generation circuit 210-2 are coupled to the input nodes of the next active clock generation circuit (not illustrated).

The output nodes of the last active clock generation circuit 210-N-1 are coupled to the input nodes of the last passive clock generation circuit 210-N. The output nodes of the of the last passive clock generation circuit 210-N are coupled to the output nodes 240-1, ..., 240-M of the apparatus 200. Accordingly, the apparatus 200 allows to output M phase-shifted clock signals 203-1, ..., 203-M with high phase accuracy.

Figure 3:
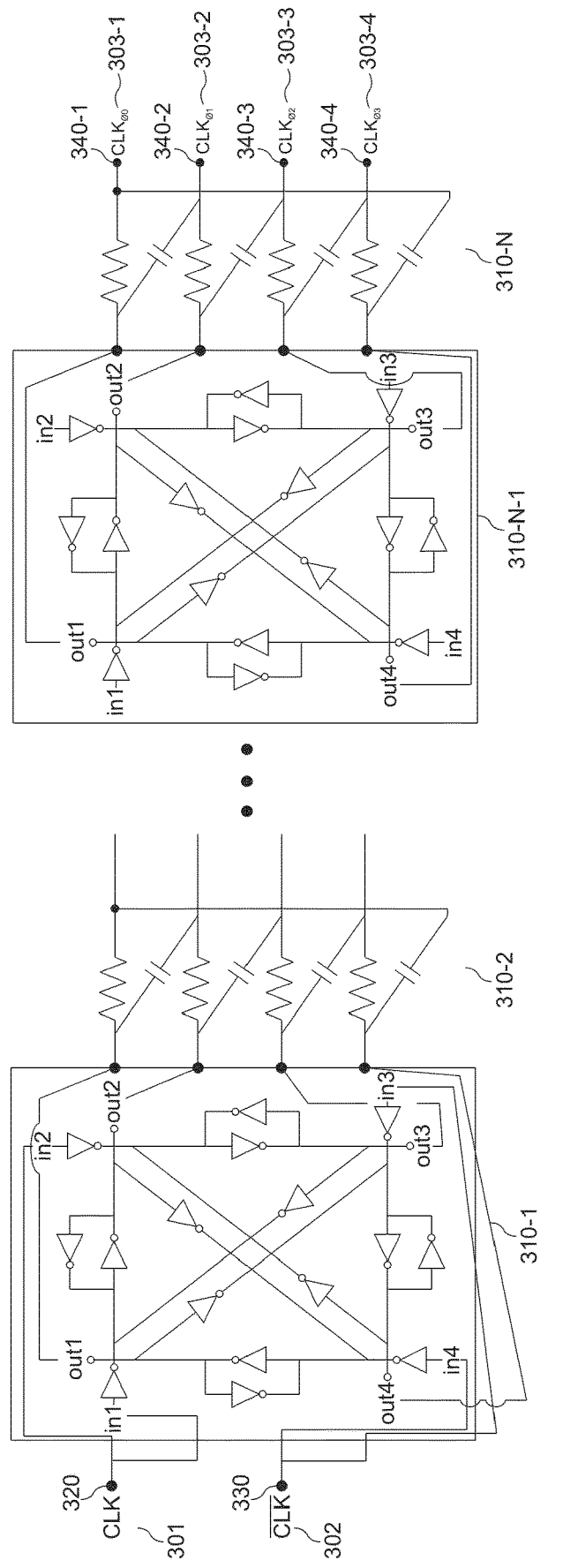
FIG. 3 illustrates a third example of an apparatus for generating a plurality of phase-shifted clock signals.

FIG. 3 illustrates an apparatus 300 for generating four phase-shifted clock signals. The apparatus 300 is similar to the above described apparatus 200. In contrast to the apparatus 200, the number of generated phase-shifted clock signals is set to four.

The apparatus 300 comprises a cascade of clock generation circuits 310-1, ..., 310-N. The cascade of clock generation circuits 310-1, ..., 310-N comprises a plurality of passive clock generation circuits and a plurality of active clock generation circuits coupled alternatingly in series. The active clock generation circuits 310-$i$ ($i=\{2k-1|k\epsilon\mathbb{N}\}$ & $i\leq N-1$) are tetrahedral injection-locked oscillators, whereas the passive clock generation circuits 310-$j$ ($j=\{2l|l\epsilon\mathbb{N}\}$ & $1\leq N$) are RC polyphase filters for four polyphases.

The input nodes of the first active clock generation circuit 310-1 are coupled to the first input node 320 and the second input node 330. The output nodes of the first active clock generation circuit 310-1 are coupled to the input nodes of the first passive clock generation circuit 310-2. The output nodes of the first passive clock generation circuit 310-2 are coupled to the input nodes of the next active clock generation circuit (not illustrated).

The output nodes of the last active clock generation circuit 310-N-1 are coupled to the input nodes of the last passive clock generation circuit 310-N. The output nodes of the of the last passive clock generation circuit 310-N are coupled to the output nodes 340-1, ..., 340-4 of the apparatus 300. Accordingly, the apparatus 300 allows to output four phase-shifted clock signals 303-1, ..., 303-4 with high phase accuracy.

Figure 4:
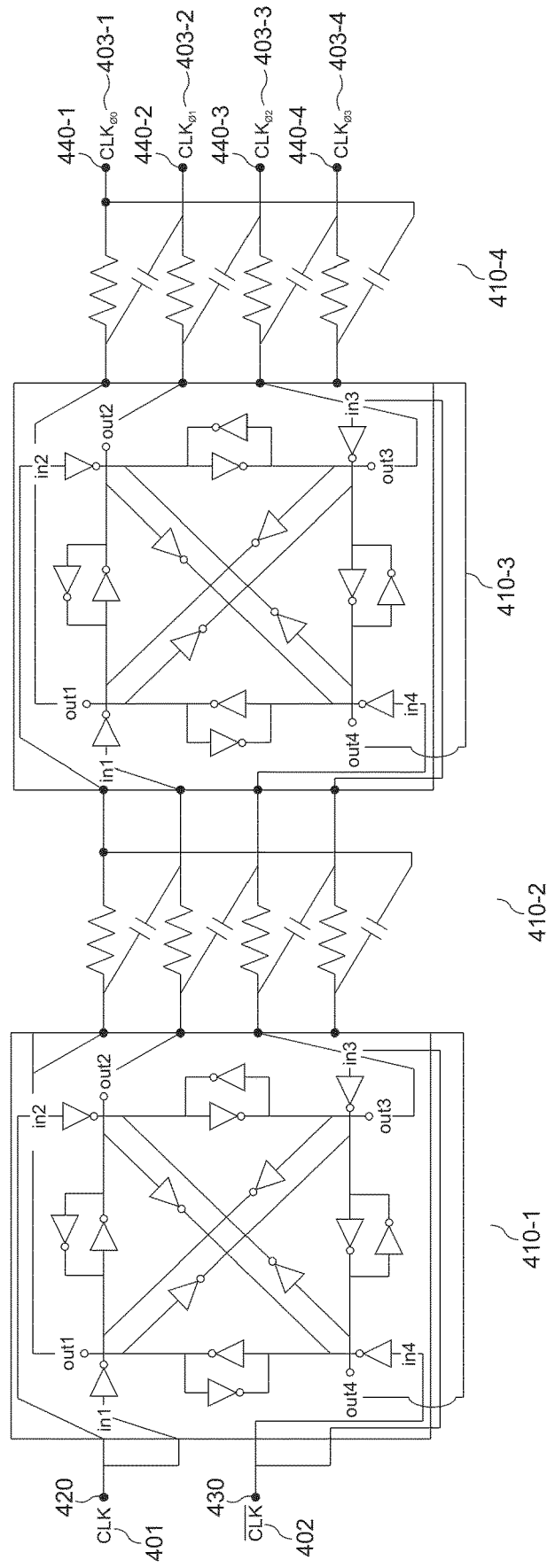
FIG. 4 illustrates a fourth example of an apparatus for generating a plurality of phase-shifted clock signals.

FIG. 4 illustrates another apparatus 400 for generating four phase-shifted clock signals. The apparatus 400 is similar to the above described apparatus 300. In contrast to the apparatus 300, number of clock generation circuits is set to four in the apparatus 400.

The apparatus 400 comprises a cascade of four clock generation circuits 410-1, ..., 410-4. The cascade of clock generation circuits 410-1, ..., 410-4 comprises two passive clock generation circuits and two active clock generation circuits coupled alternatingly in series. The active clock generation circuits 410-1 and 410-3 are tetrahedral injection-locked oscillators, whereas the passive clock generation circuits 410-2 and 410-4 are RC polyphase filters for four polyphases.

The input nodes of the first active clock generation circuit 410-1 are coupled to the first input node 420 and the second input node 430. The output nodes of the first active clock generation circuit 410-1 are coupled to the input nodes of the first passive clock generation circuit 410-2. The output nodes of the first passive clock generation circuit 410-2 are coupled to the input nodes of the second active clock generation circuit 410-3. The output nodes of the second active clock generation circuit 410-3 are coupled to the input nodes of the second passive clock generation circuit 410-4.

The output nodes of the of the second passive clock generation circuit 410-4 are coupled to the output nodes 440-1, ..., 440-4 of the apparatus 400. Accordingly, the apparatus 400 allows to output four phase-shifted clock signals 403-1, ..., 403-4 with high phase accuracy.

Figure 5:
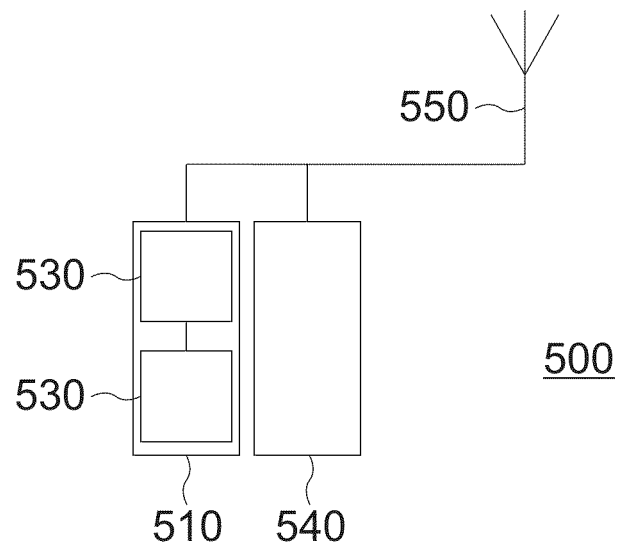
FIG. 5 illustrates an example of a base station.

An example of an implementation using multiphase clock signal generation according to one or more aspects of the architecture described above in connection with FIGS. 1 to 4 or one or more examples described above in connection with FIGS. 1 to 4 is illustrated in FIG. 5. FIG. 5 schematically illustrates an example of a radio base station 500 (e.g. for a femtocell, a picocell, a microcell or a macrocell) comprising an apparatus 520 for generating a plurality of phase-shifted clock signals as proposed.

The apparatus 520 for generating a plurality of phase-shifted clock signals is part of a receiver 510 (being an example for an electronic system). The receiver 510 additionally comprises at least one electronic device 530 coupled to at least part of the plurality of output nodes of the apparatus 520 for receiving at least part of the plurality of phase-shifted clock signals. For example, the at least one electronic device 530 may be one of an analog-to-digital converter or a Radio Frequency (RF) mixer. If the electronic device 530 is a RF mixer such as a quadrature mixer or an image rejection mixer, the apparatus 520 may allow to supply the plurality of phase-shifted clock signals with very precise phase alignment to the RF mixer and, hence, meet the requirements of the RF mixer.

The receiver 510 is coupled to an antenna element 550 of the base station 500 (either directly or indirectly via one or more intermediate elements such as a filter or a Low Noise Amplifier, LNA).

Further, the base station 500 comprises a transmitter 540 configured to generate a RF transmit signal. The transmitter 540 may use the antenna element 550 or another antenna element (not illustrated) of the base station 500 for radiating the RF transmit signal to the environment. Alternatively or additionally, the transmitter 540 (being another example for an electronic system) may comprise an apparatus for generating a plurality of phase-shifted clock signals as proposed. For example, a digital-to-analog converter or a RF mixer of the transmitter 540 may receive and use at least part of the plurality of phase-shifted clock signals generated by the apparatus for generating a plurality of phase-shifted clock signals.

To this end, a base station with improved multiphase clock signal generation may be provided.

The base station 500 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 6:
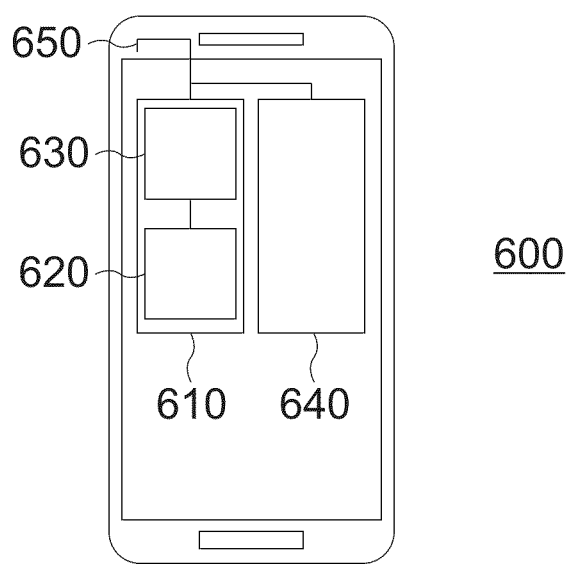
FIG. 6 illustrates an example a mobile device.

Another example of an implementation using multiphase clock signal generation according to one or more aspects of the architecture described above in connection with FIGS. 1 to 4 or one or more examples described above in connection with FIGS. 1 to 4 is illustrated in FIG. 6. FIG. 6 schematically illustrates an example of a mobile device 600 (e.g. mobile phone, smartphone, tablet-computer, or laptop) comprising an apparatus 620 for generating a plurality of phase-shifted clock signals as proposed.

The apparatus 620 for generating a plurality of phase-shifted clock signals is part of a receiver 610 (being an example for an electronic system). The receiver 610 additionally comprises at least one electronic device 630 coupled to at least part of the plurality of output nodes of the apparatus 620 for receiving at least part of the plurality of phase-shifted clock signals. For example, the at least one electronic device 630 may be one of an analog-to-digital converter or a RF mixer. If the electronic device 630 is a RF mixer such as a quadrature mixer or an image rejection mixer, the apparatus 620 may allow to supply the plurality of phase-shifted clock signals with very precise phase alignment to the RF mixer and, hence, meet the requirements of the RF mixer.

The receiver 610 is coupled to an antenna element 650 of the mobile device 600 (either directly or indirectly via one or more intermediate elements such as a filter or an LNA).

Further, the mobile device 600 comprises a transmitter 640 configured to generate a RF transmit signal. The transmitter 640 may use the antenna element 650 or another antenna element (not illustrated) of the mobile device 600 for radiating the RF transmit signal to the environment. Alternatively or additionally, the transmitter 640 (being another example for an electronic system) may comprise an apparatus for generating a plurality of phase-shifted clock signals as proposed. For example, a digital-to-analog converter or a RF mixer of the transmitter 640 may receive and use at least part of the plurality of phase-shifted clock signals generated by the apparatus for generating a plurality of phase-shifted clock signals.

To this end, a mobile device with improved multiphase clock signal generation may be provided.

The mobile device 600 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using multiphase clock signal generation according to the proposed architectures or one or more of the examples described above may be configured to operate according to one of the 3GPP-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The electronic systems exemplarily described above in connection with FIGS. 5 and 6 mainly focus on wireless communication. However, the proposed multiphase clock signal generation is not limited to mobile communications. In general, the proposed multiphase clock signal generation may be used for any electronic system using a plurality of phase-shifted clock signals. For example, an electronic system comprising an apparatus for generating a plurality of phase-shifted clock signals according to the proposed concept may (apart from the above described base station and the above described mobile device) be one of a consumer product, a router (wired or wireless), an ethernet switch, a transmitter (wired or wireless), a receiver (wired or wireless) and a transceiver (wired or wireless).

The examples described herein may be summarized as follows:

Example 1 is an apparatus for generating a plurality of phase-shifted clock signals, comprising: a first input node configured to receive a first reference clock signal; a second input node configured to receive a second reference clock signal; a plurality of output nodes each configured to output one of the plurality of phase-shifted clock signals; and a cascade of coupled clock generation circuits configured to generate the plurality of phase-shifted clock signals based on the first reference clock signal and the second reference clock signal, wherein input nodes of the first clock generation circuit of the cascade of clock generation circuits are coupled to the first input node and the second input node, wherein output nodes of the last clock generation circuit of the cascade of clock generation circuits are coupled to the plurality of output nodes, wherein at least one of the plurality of clock generation circuits is an active circuit, and wherein at least one of the plurality of clock generation circuits is a passive circuit.

Example 2 is the apparatus of example 1, wherein the plurality of phase-shifted clock signals is four or more phase-shifted clock signals.

Example 3 is the apparatus of example 1 or example 2, wherein the plurality of phase-shifted clock signals are phase shifted by a predetermined phase shift with respect to each other.

Example 4 is the apparatus of any of examples 1 to 3, wherein the at least one passive clock generation circuit comprises exclusively passive electronic elements.

Example 5 is the apparatus of any of examples 1 to 4, wherein the at least one active clock generation circuit comprises at least one active electronic element.

Example 6 is the apparatus of any of examples 1 to 5, wherein the cascade of clock generation circuits comprises a plurality of passive clock generation circuits and a plurality of active clock generation circuits coupled alternatingly in series.

Example 7 is the apparatus of any of examples 1 to 5, wherein the cascade of clock generation circuits comprises at least two passive clock generation circuits coupled in series, wherein the cascade of clock generation circuits comprises at least two active clock generation circuits coupled in series.

Example 8 is the apparatus of any of examples 1 to 5, wherein the cascade of coupled clock generation circuits comprises two clock generation circuits, wherein the first clock generation circuit of the cascade of clock generation circuits is a passive circuit, and wherein the last clock generation circuit of the cascade of clock generation circuits is an active circuit.

Example 9 is the apparatus of any of examples 1 to 7, wherein the cascade of coupled clock generation circuits comprises at least three clock generation circuits.

Example 10 is the apparatus of any of examples 1 to 9, wherein the at least one active clock generation circuit is an injection-locked oscillator.

Example 11 is the apparatus of any of examples 1 to 10, wherein the at least one passive clock generation circuit is an RC polyphase filter, wherein the number of polyphases of the RC polyphase filter is equal to the number the plurality of phase-shifted clock signals.

Example 12 is the apparatus of any of examples 1 to 11, wherein the second reference clock signal is inverted with respect to the first reference clock signal.

Example 13 is an electronic system, comprising: the apparatus according to any of examples 1 to 12; and at least one electronic device coupled to at least part of the plurality of output nodes for receiving at least part of the plurality of phase-shifted clock signals.

Example 14 is the electronic system of example 13, wherein the at least one electronic device is one of a digital-to-analog converter, an analog-to-digital converter and a radio frequency mixer.

Example 15 is the electronic system of example 13 or example 14, wherein the wherein the electronic system is one of a consumer product, a base station, a mobile device, a router, an ethernet switch, a transmitter, a receiver and a transceiver.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for generating a plurality of phase-shifted clock signals, comprising:
    a first input node configured to receive a first reference clock signal;
    a second input node configured to receive a second reference clock signal;
    a plurality of output nodes each configured to output one of the plurality of phase-shifted clock signals; and
    a cascade of coupled clock generation circuits configured to generate the plurality of phase-shifted clock signals based on the first reference clock signal and the second reference clock signal, wherein input nodes of a first clock generation circuit of the cascade of clock generation circuits are coupled to the first input node and the second input node, wherein output nodes of a last clock generation circuit of the cascade of clock generation circuits are coupled to the plurality of output nodes, wherein the cascade of clock generation circuits comprises at least one active clock generation circuit and at least one passive clock generation circuit that are coupled alternatingly in series,
    wherein the active clock generation circuit is an injection-locked oscillator, and the passive clock generation circuit is an RC polyphase filter.

2. The apparatus of claim 1, wherein the plurality of phase-shifted clock signals is four or more phase-shifted clock signals.

3. The apparatus of claim 1, wherein the plurality of phase-shifted clock signals are phase shifted by a predetermined phase shift with respect to each other.

4. The apparatus of claim 1, wherein the at least one passive clock generation circuit comprises exclusively passive electronic elements.

5. The apparatus of claim 1, wherein the at least one active clock generation circuit comprises at least one active electronic element.

6. The apparatus of claim 1, wherein the cascade of clock generation circuits comprises a plurality of passive clock generation circuits and a plurality of active clock generation circuits coupled alternatingly in series.

7. The apparatus of claim 1, wherein the cascade of clock generation circuits comprises at least two passive clock generation circuits coupled in series, wherein the cascade of clock generation circuits comprises at least two active clock generation circuits coupled in series.

8. The apparatus of claim 1, wherein the cascade of coupled clock generation circuits comprises two clock generation circuits, wherein the first clock generation circuit of the cascade of clock generation circuits is a passive circuit, and wherein the last clock generation circuit of the cascade of clock generation circuits is an active circuit.

9. The apparatus of claim 1, wherein the cascade of coupled clock generation circuits comprises at least three clock generation circuits.

10. The apparatus of claim 1, wherein the number of polyphases of the RC polyphase filter is equal to the number the plurality of phase-shifted clock signals.

11. The apparatus of claim 1, wherein the second reference clock signal is inverted with respect to the first reference clock signal.

12. An electronic system, comprising:
    the apparatus according to claim 1; and
    at least one electronic device coupled to at least part of the plurality of output nodes for receiving at least part of the plurality of phase-shifted clock signals.

13. The electronic system of claim 12, wherein the at least one electronic device is one of a digital-to-analog converter, an analog-to-digital converter and a radio frequency mixer.

14. The electronic system of claim 12, wherein the wherein the electronic system is one of a consumer product, a base station, a mobile device, a router, an ethernet switch, a transmitter, a receiver and a transceiver.

* * * * *